United States Patent
Wang

(10) Patent No.: US 7,164,222 B2
(45) Date of Patent: Jan. 16, 2007

(54) FILM BULK ACOUSTIC RESONATOR (FBAR) WITH HIGH THERMAL CONDUCTIVITY

(75) Inventor: Li-Peng Wang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 10/607,679

(22) Filed: Jun. 26, 2003

(65) Prior Publication Data
US 2004/0263026 A1    Dec. 30, 2004

(51) Int. Cl.
*H01L 41/08*    (2006.01)
(52) U.S. Cl. .................. 310/341; 310/342; 310/346; 310/349; 310/347; 333/229; 333/234; 333/191; 333/187
(58) Field of Classification Search ........ 310/341–342, 310/346–349; 333/187, 189, 229, 234, 191
See application file for complete search history.

(56) References Cited

U.S. PATENT DOCUMENTS
6,507,093 B1 * 1/2003 Kaneda et al. .............. 257/666

2004/0056735 A1 * 3/2004 Nomura et al. ............. 333/133

FOREIGN PATENT DOCUMENTS
EP    1217734 A2 *    6/2002

* cited by examiner

*Primary Examiner*—Tom Dougherty
*Assistant Examiner*—J. Aguirrechea
(74) *Attorney, Agent, or Firm*—Blakely, Sokoloff, Taylor & Zafman LLP

(57) ABSTRACT

The specification discloses embodiments of an apparatus comprising a film bulk acoustic resonator (FBAR) filter comprising a piezoelectric membrane having a portion thereof sandwiched between a first electrode and a second electrode, the piezoelectric membrane being suspended from at least two edges thereof, and a heat transfer layer placed on the piezoelectric membrane surrounding, but not in contact with, the first electrode. Also disclosed are embodiments of a process comprising sandwiching a portion of the piezoelectric membrane between a first electrode and a second electrode, suspending a piezoelectric membrane from at least two edges thereof, and placing a heat transfer layer on the piezoelectric membrane surrounding, but not in contact with, the first electrode. Other embodiments are disclosed and claimed.

24 Claims, 6 Drawing Sheets ions of the present invention are described with reference to the figures, which are illustrative only and are not to scale. In all figures, like reference numerals refer to like parts throughout the various views unless otherwise specified.

FILM BULK ACOUSTIC RESONATOR (FBAR) WITH HIGH THERMAL CONDUCTIVITY

TECHNICAL FIELD

The present invention relates generally to film bulk acoustic resonator (FBAR) filters and in particular, but not exclusively, to FBARs designed to have a high thermal conductivity.

BACKGROUND

Film Bulk Acoustic Resonator (commonly known as FBAR) are used in a variety of applications, for example as filters in wireless communication systems. When used in wireless communication, single membrane FBAR filters have been used primarily on the receiving side because the receiving side usually involves substantially lower power levels. Single-membrane FBARs have not been used extensively on the transmission side because the high power levels involved generate a lot of heat in the FBARs, but the construction of the FBARs prevents sufficiently rapid transfer of the thermal energy.

FIGS. 1A and 1B illustrate a film bulk acoustic resonator (FBAR) array 100. FIG. 1A illustrates that the FBAR array 100 comprises a piezoelectric membrane 102 having a plurality of individual FBARs 104 arranged thereon. The individual FBARs 104 are electrically connected to at least one other FBAR by interconnects 106 through either top or bottom electrodes. FIG. 1B illustrates a cross section of the FBAR array 100. The piezoelectric membrane 102 is suspended along at least two of its edges by supports 112, and the array includes a plurality of individual FBARs 104, each comprising a portion of the membrane 102 sandwiched between a first electrode (in this instance the upper electrode 108) and a second electrode (in this instance the lower electrode 110). The active area of each FBAR is the portion of the piezoelectric membrane in which the first and second electrodes overlap, because only the area where each FBAR's first and second electrodes overlap—in other words, the area between electrodes—can be subject to an applied electric field.

During operation of the FBAR array, a signal is input to each of the FBARs 104. As a result, heat is generated in the piezoelectric area and the active area experiences a temperature rise. The only means by which the thermal energy can be transferred away from the active areas is laterally through the membrane, as illustrated by the arrows in the figure. The thermal energy travels through the membrane 102 and is dissipated into the supports 112. Since the center of the membrane is farthest from the supports 112, the thermal energy generated by an FBAR at or near the center of the membrane dissipates more slowly and that area experiences a greater temperature increase. For FBARs closer to the edge of the membrane (and thus closer to the supports) the heat dissipates more quickly and the temperature increase experienced by these FBARs is substantially lower. In applications in which a substantial amount of power is input to the FBAR array (e.g., transmission applications in which the power input can exceed 1 W), the temperature rise at the center of the FBAR array can exceed 100 degrees. Such large temperature rises can shift the resonant frequency of the FBAR out of specification, and in some cases can damage the FBAR array and render the entire thing useless.

BRIEF DESCRIPTION OF THE DRAWINGS

Non-limiting and non-exhaustive embodiments of the present invention are described with reference to the figures, which are illustrative only and are not to scale. In all figures, like reference numerals refer to like parts throughout the various views unless otherwise specified.

DETAILED DESCRIPTION OF THE ILLUSTRATED EMBODIMENTS

Embodiments of a film bulk acoustic resonator (FBAR) filter apparatus having a high thermal conductivity and methods for making the same are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1A:
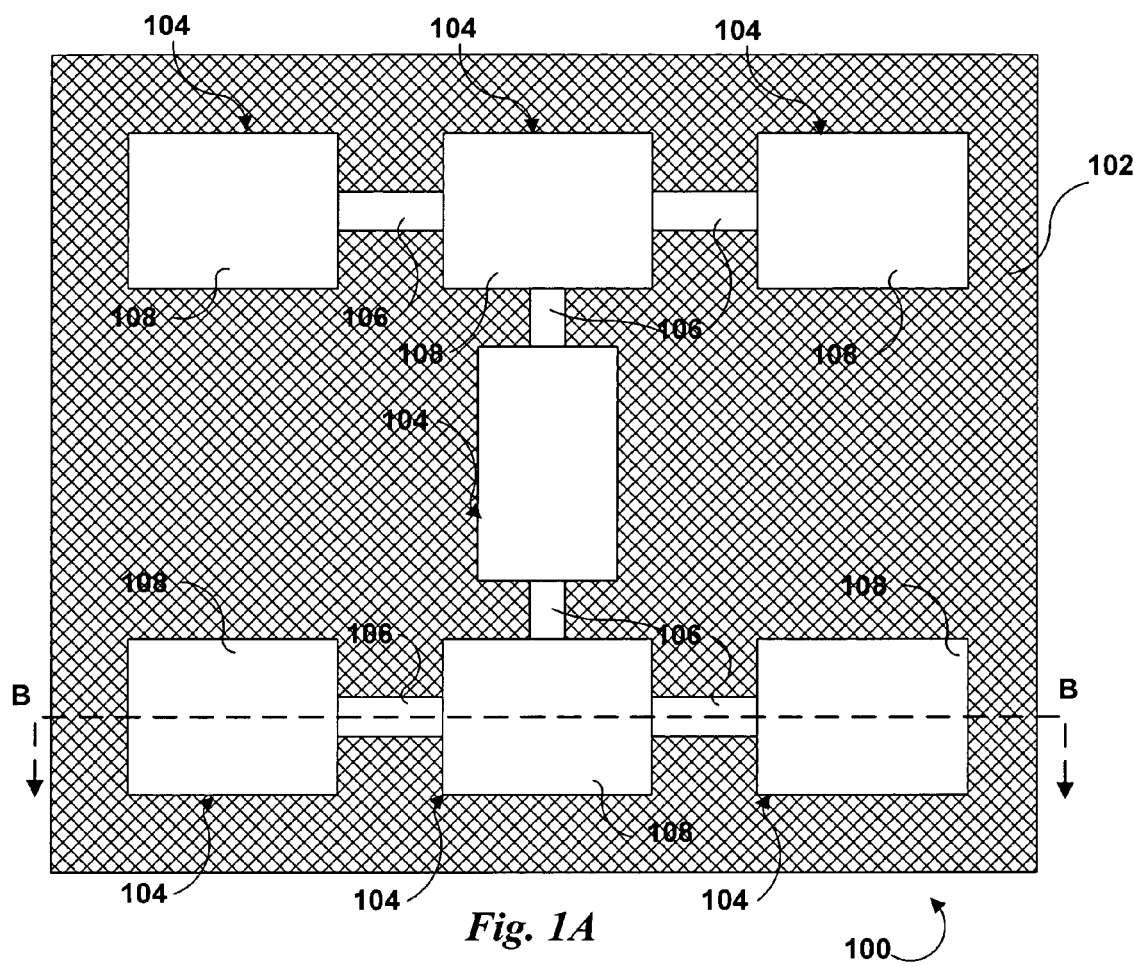
FIG. 1A is a plan view of a single-membrane film bulk acoustic resonator (FBAR) array.
Figure 1B:
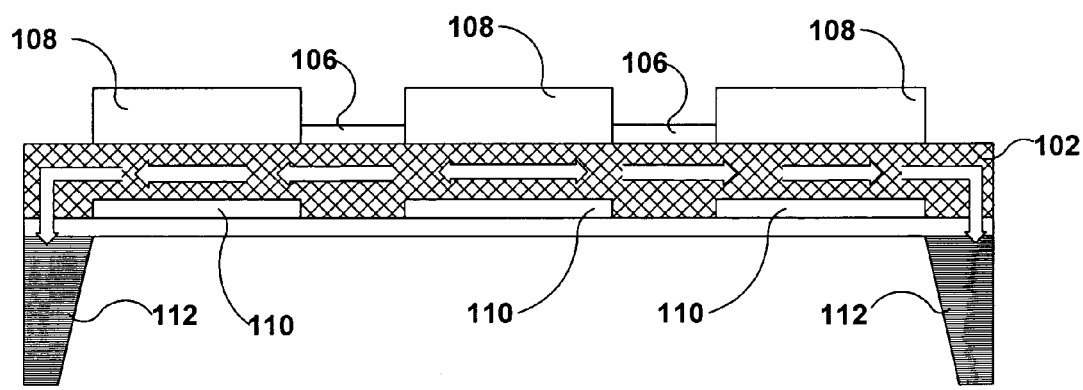
FIG. 1B is a sectional view of the single-membrane FBAR array of FIG. 1A taken along section line B—B.
Figure 2A:
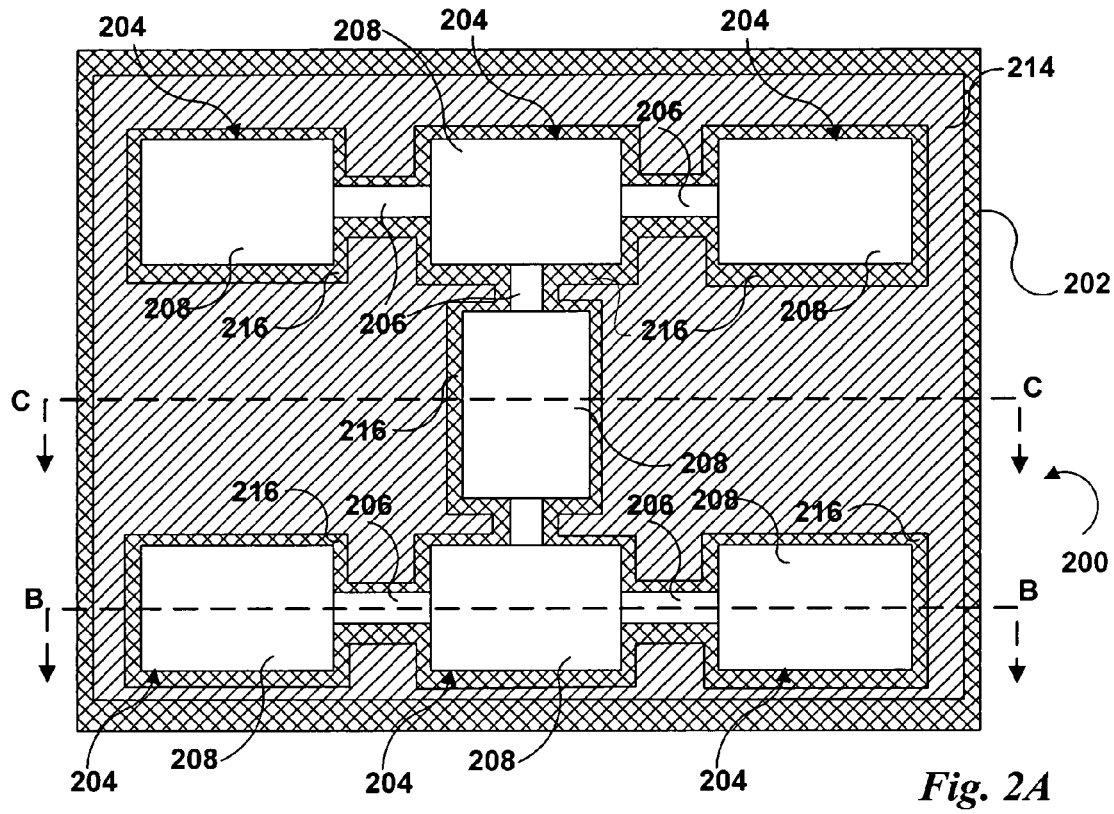
FIG. 2A is a plan view of an embodiment of an FBAR array according to the present invention.
Figure 2B:
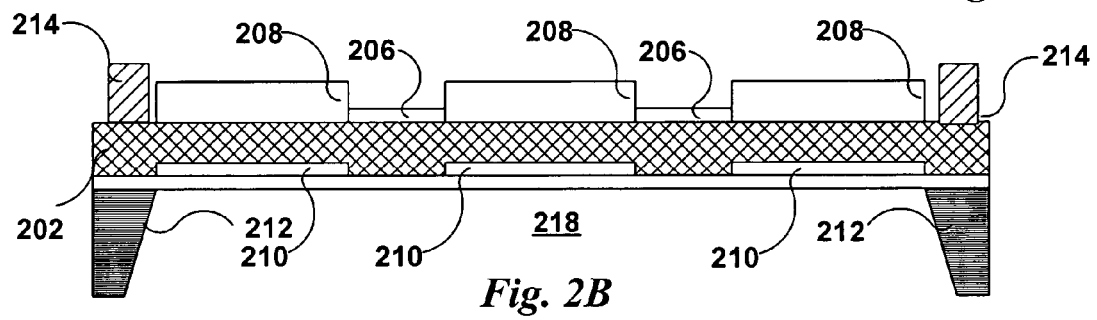
FIG. 2B is a sectional view of the FBAR array shown in FIG. 2A, taken along section line B—B.
Figure 2C:
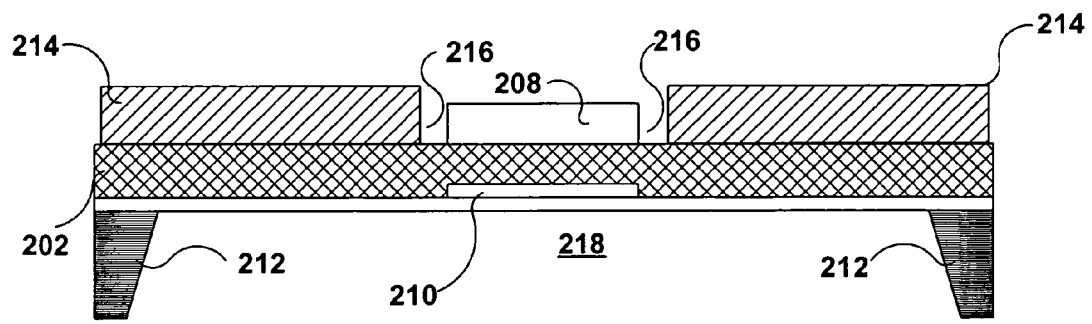
FIG. 2C is a sectional view of the FBAR array shown in FIG. 2A taken along the section line C—C.

FIGS. 2A–2C illustrate an embodiment of an FBAR array 200 with enhanced heat transfer characteristics. As seen in the plan view of FIG. 2A, the FBAR array 200 includes a piezoelectric membrane 202 having a plurality of individual FBARs 204 arranged thereon, with the individual FBARs electrically connected by means of interconnects 206 through either top or bottom electrodes. Also placed on the piezoelectric membrane 202 is a heat transfer layer 214, which is applied to the membrane so that it surrounds, but does not touch, the electrodes 208 of each FBAR in the array; in other words, there is a gap 216 between the edges of the heat transfer layer 214 and the electrodes 208. Similarly, there is a gap 216 between the edges of the heat transfer layer 214 and the interconnects 206. The gap 216 exists to prevent the heat transfer layer 214 from touching and short-circuiting the electrodes 208 or the interconnects 206. The heat transfer layer extends to the edges of the piezoelectric membrane 202.

FIGS. 2B and 2C further illustrate the embodiment of the FBAR array 200. The piezoelectric membrane 202 is supported along all four of its edges by supports 212. In other embodiments, however, the membrane 202 can be supported along as few as two of its edges. Each FBAR 204 comprises a portion of the piezoelectric membrane 202 sandwiched between a first electrode (in this instance the upper electrode 208) and a second electrode (in this instance the lower electrode 210). In each FBAR 204 within the FBAR array 200, the upper electrode 208 and the lower electrode 210 are attached to opposite sides of the piezoelectric membrane 202, generally in such a way that the first and second electrodes are substantially aligned.

In an embodiment of the FBAR 200, the piezoelectric membrane is thin, generally on the order of 2–5 microns, although in alternative embodiments the thickness of the membrane may differ. Moreover, in one embodiment the piezoelectric membrane 202 can be made of aluminum nitride (AlN), although in other embodiments different piezoelectric materials such as zinc oxide (ZnO) can be used. The exact choice of material for the piezoelectric membrane will depend on the required or desired characteristics of the individual FBARs 204, such as their resonant frequencies, as well as the required or desired characteristics of the FBAR array 200.

The supports 212 are substantially thicker than the piezoelectric membrane 202 and create an air gap 218 underneath the membrane. The gap 218 assures that there is a mismatch of acoustic impedance between the piezoelectric membrane and the gap, so there will be no transfer of acoustic energy from the membrane. The supports 212 also provide a heat sink for thermal energy traveling laterally through the piezoelectric layer 202 and the heat transfer layer 214. Because they function as heat sinks, the supports 212 can be made using materials with a thermal conductivity substantially higher than that of the piezoelectric membrane. In one embodiment, the supports 212 can be made using silicon, although in different embodiments different materials can be used.

The heat transfer layer 214 is thicker than the piezoelectric membrane, and is made of a material having a thermal conductivity substantially higher than that of the piezoelectric membrane to maximize heat transfer from the FBAR. In one embodiment, the piezoelectric membrane can be made of aluminum nitride (AlN), which has a heat transfer coefficient of 50 W/m° C., while the heat transfer layer is made of a metal having a relatively higher thermal conductivity, such as gold (Au) with a heat transfer coefficient of 315 W/m° C., or aluminum (Al) with a thermal conductivity of 237 W/m° C. In other embodiments, however, the heat transfer layer 214 can be made of any material that has a suitably high thermal conductivity and is compatible with the other materials used in the FBAR array 200; examples include silicon (Si), which has a thermal conductivity of about 148 W/m° C. or silicon-based materials, which have thermal conductivities in the range of 100–200 W/m° C.

Figure 3A:
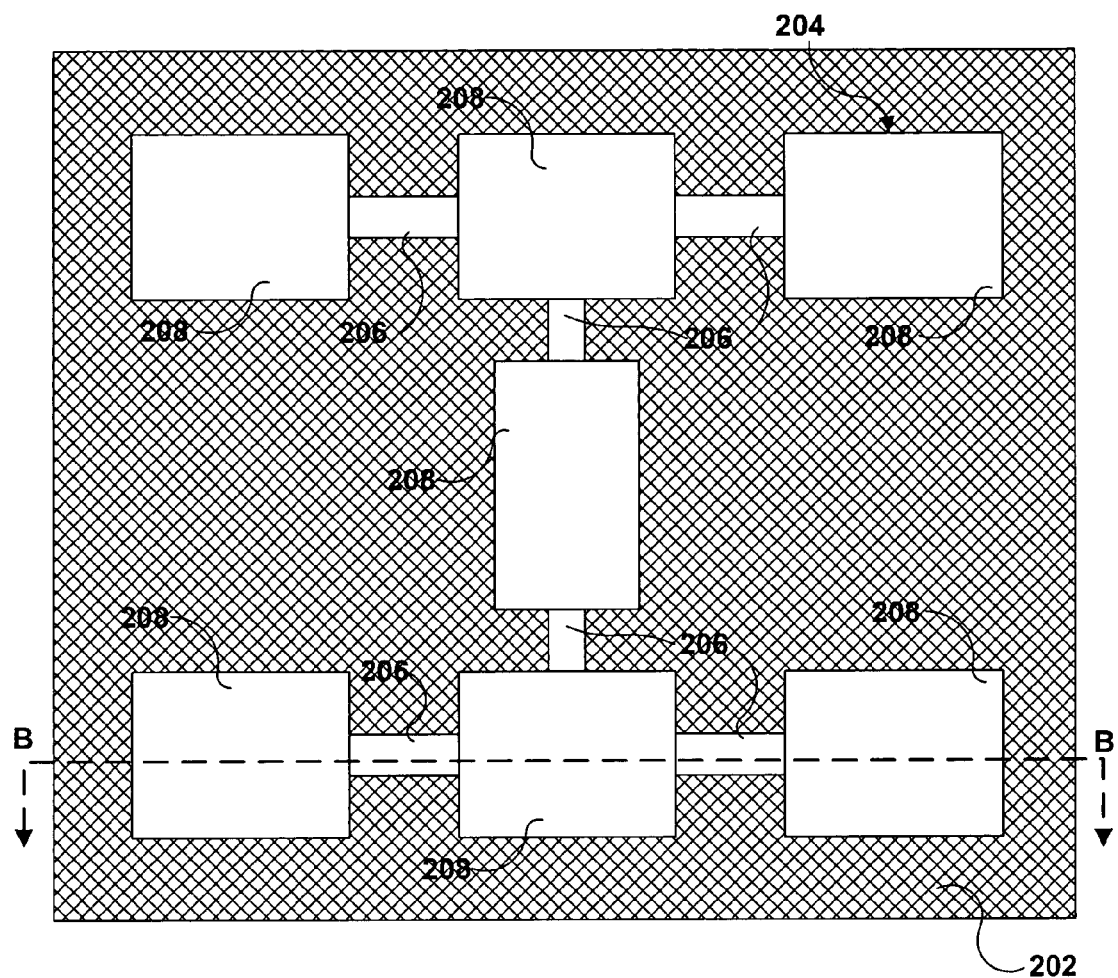
FIGS. 3A–3E are drawings of an embodiment of a process for building an FBAR such as that shown in FIG. 2A–2C.
Figure 3B:
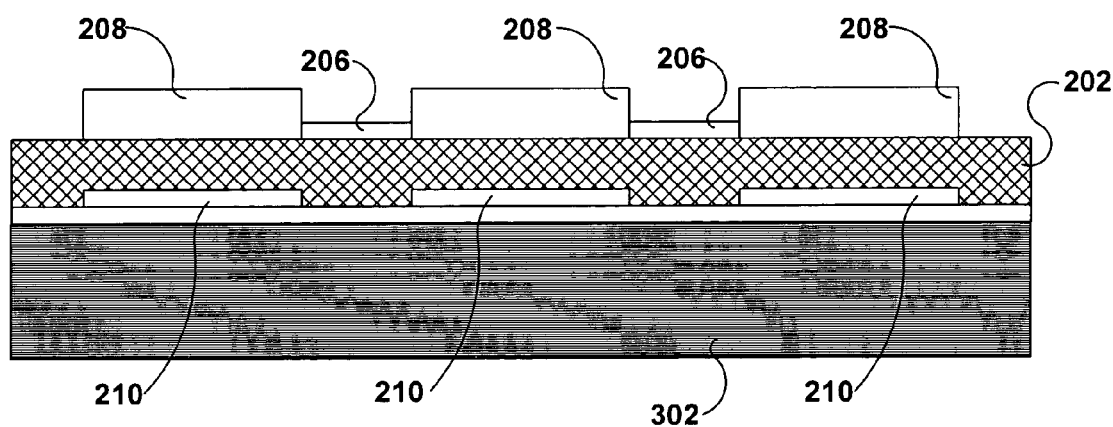

FIGS. 3A–3E illustrate an embodiment of a process for manufacturing an FBAR array such as the FBAR array 200. FIGS. 3A and 3B illustrates the manufacture a basic FBAR array. A support layer 302 is first deposited onto a substrate (not shown). A plurality of second electrodes 210 is then patterned and deposited on the silicon support layer using conventional techniques known in the art. Following the creation of the plurality of second electrodes 210, a thin layer of piezoelectric material is placed on top of the second electrodes to create the piezoelectric membrane 202. Finally, the first electrodes 208 and interconnects 206 are patterned and deposited on the piezoelectric membrane 202.

Figure 3C:
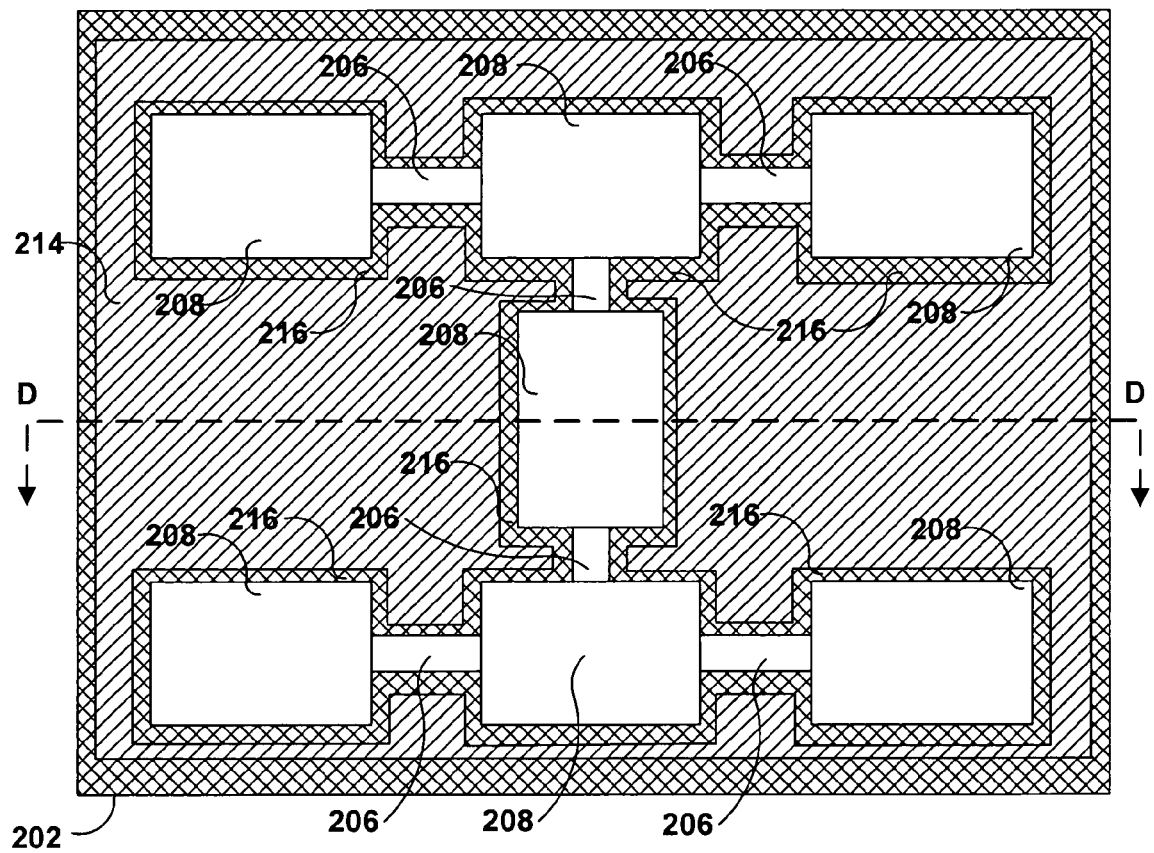
Figure 3D:
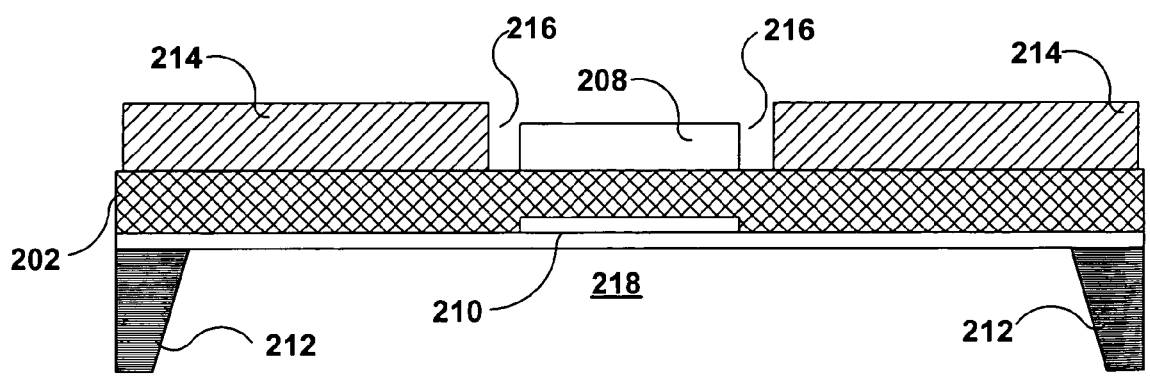

FIGS. 3C and 3D illustrate the addition of a heat transfer layer to the basic FBAR array to create an embodiment of the FBAR 200. The heat transfer layer 214 is placed on the piezoelectric membrane 202 surrounding, but not touching, the individual electrodes 208 or the interconnects 206; in other words, gaps 216 must remain between the heat transfer layer 214 and the electrodes 208 and interconnects 206. As discussed above, the gaps 216 must remain to avoid short-circuiting the electrodes 208 or interconnects 206. The heat transfer layer 214 extends to the edges of the piezoelectric membrane.

Following placement of the heat transfer layer 214, a portion of the support layer 302 is etched away from the area underneath the piezoelectric membrane 202, leaving a cavity 218 underneath the membrane and leaving the membrane supported from at least two of its edges by a pair of supports 212. As discussed above, the cavity 218 usually contains air and is necessary to provide the proper differences in acoustic impedance between the membrane and the cavity that keeps acoustic energy within the piezoelectric membrane.

The heat transfer layer 214 can be placed on the piezoelectric membrane 208 in various ways. The choice of method for placing the heat transfer layer will depend, for example, on the material used for the heat transfer layer, the manufacturing processes used to construct the particular FBAR array, or further processing or packaging after the heat transfer layer is placed on the piezoelectric membrane. In one embodiment, the heat transfer layer can be screen printed onto the membrane. This technique has good resolution and can be used to add the heat transfer layer without changing the overall size of the FBAR. Screen printing is useful when further components, such as a bonding plate, will be added using a sealing ring around the perimeter of the membrane 202. In another embodiment, the heat transfer layer can be placed on the membrane using electroplating. Electroplating also has good resolution and allows for the easy integration of later components, such as the top bonding plate, using compression bonding. In yet another embodiment, the heat transfer layer can be placed on the membrane using solder plating. Solder plating provides the required resolutions and allows for the easy integration of later components or packaging by solder bonding.

Figure 3E:
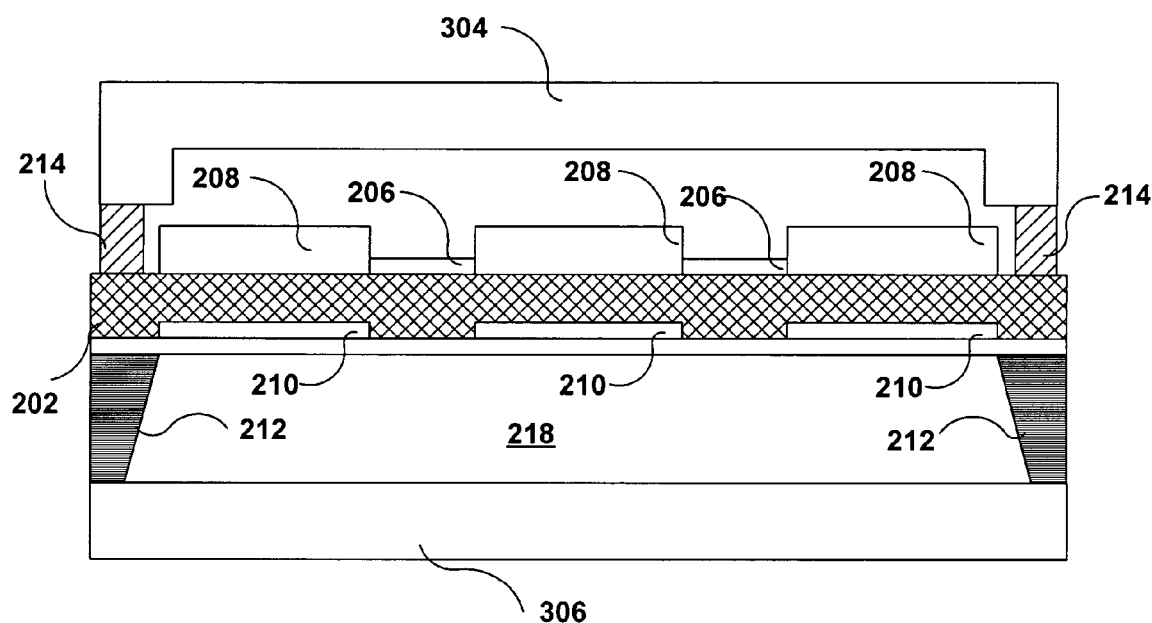

FIG. 3E illustrates an embodiment of a packaged FBAR array 200. To complete packaging of the FBAR array, a bonding plate 304 can be attached thereto. The bonding plate 304 can be attached directly to the heat transfer layer 214 around the edges of the membrane. The bonding plate can be made of a material having a relatively high thermal conductivity and can include a notch or cavity therein so that the plate does not contact the FBAR array and exert a force thereon. When in place, the bonding plate helps keep debris from contaminating the surface of the FBAR array and, because it is in thermal contact with the heat transfer layer, also helps conduct heat away from the FBAR array. Further processing and packaging can take place, for example attaching a lower bonding plate 306 to the supports 212. As with the bonding plate 304, the lower bonding plate 306 helps keep debris from entering the cavity 218 and, because it is in thermal contact with the supports, also helps conduct heat away from the FBAR array.

Figure 4:
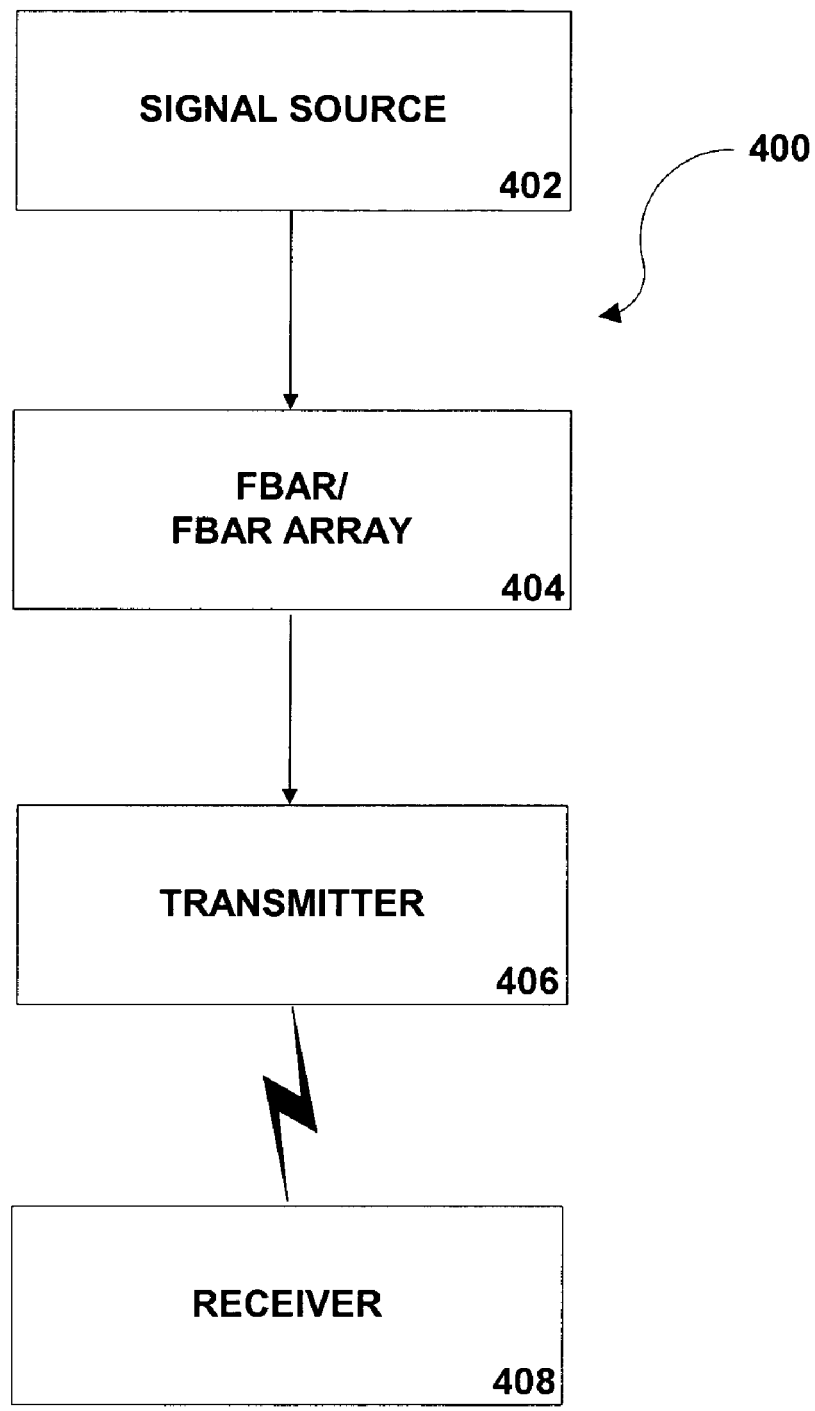
FIG. 4 is a drawing of an embodiment of a system including an FBAR or FBAR array.

FIG. 4 illustrates an embodiment of a system 400 using an FBAR or FBAR array. The illustrated system 400 is highly simplified, and in other embodiments may include more, less, or different components. In the system 400, a signal source such as a transmitter 402 is coupled to an individual FBAR or FBAR array 404. The FBAR is in turn coupled to a transmitter 406, and the transmitter 406 is coupled to a receiver 408. In operation of the system 400, the signal source generates a signal and transmits the signal to the electrodes of the FBAR or FBAR array 404. The FBAR or FBAR array 404 filters the signal and forwards it to a transmitter 406, which transmits the signal to a receiver 408, for example through wireless transmission.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
   a film bulk acoustic resonator (FBAR) comprising a piezoelectric membrane having a portion thereof sandwiched between a first electrode and a second electrode, the piezoelectric membrane being suspended from at least two edges thereof; and
   a heat transfer layer placed on at least part of the suspended portion of the piezoelectric membrane substantially surrounding, but not in electrical contact with, the first electrode.

2. The apparatus of claim 1 wherein the heat transfer layer has a high thermal conductivity relative to the piezoelectric membrane.

3. The apparatus of claim 1 wherein the heat transfer layer extends from near the first electrode to the edges of the piezoelectric membrane.

4. The apparatus of claim 1 wherein the piezoelectric membrane is suspended from its edges by a pair of supports, the supports having a high thermal conductivity relative to the piezoelectric membrane.

5. The apparatus of claim 4 wherein the supports are silicon.

6. The apparatus of claim 1 wherein the piezoelectric material comprises aluminum nitride (AlN) or zinc oxide (ZnO).

7. The apparatus of claim 1 wherein the heat transfer layer comprises a metal.

8. The apparatus of claim 7 wherein the metal comprises gold (Au) or aluminum (Al).

9. An apparatus comprising:
   a plurality of coupled film bulk acoustic resonators (FBARs) on a piezoelectric membrane suspended from at least two edges, each FBAR comprising a portion of the piezoelectric membrane sandwiched between a first electrode and a second electrode;
   a heat transfer layer placed on at least part of the suspended portion of the piezoelectric membrane substantially surrounding, but not in electrical contact with, the plurality of first electrodes.

10. The apparatus of claim 9 wherein the heat transfer layer has a high thermal conductivity relative to the piezoelectric membrane.

11. The apparatus of claim 9 wherein the heat transfer layer extends from near the plurality of first electrodes to the edges of the piezo electric membrane.

12. The apparatus of claim 9 wherein the piezoelectric membrane is suspended from its edges by a pair of supports, the supports having a high thermal conductivity relative to the piezoelectric membrane.

13. The apparatus of claim 12 wherein the supports are silicon.

14. The apparatus of claim 9 wherein the piezoelectric material comprises aluminum nitride (AlN) or zinc oxide (ZnO).

15. The apparatus of claim 9 wherein the heat transfer layer comprises a metal.

16. The apparatus of claim 15 wherein the metal comprises gold (Au) or aluminum (Al).

17. A system comprising:
   a signal source;
   an FBAR coupled to the signal source, the FBAR comprising
      a piezoelectric membrane having a portion thereof sandwiched between a first electrode and a second electrode, the piezoelectric membrane being suspended from at least two edges thereof, and
      a heat transfer layer placed on at least part of the suspended portion of the piezoelectric membrane substantially surrounding, but not in electrical contact with, the first electrode; and
   a receiver to receive a signal generated by the signal source and passed through the FBAR.

18. The system of claim 17 wherein the heat transfer layer has a high thermal conductivity relative to the piezoelectric membrane.

19. The system of claim 17 wherein the heat transfer layer extends from near the first electrode to the edges of the piezoelectric membrane.

20. The system of claim 17 wherein the piezoelectric membrane is suspended from its edges by a pair of supports, the supports having a high thermal conductivity relative to the piezoelectric membrane.

21. The system of claim 20 wherein the supports are silicon.

22. The system of claim 17 wherein the piezoelectric material comprises aluminum nitride (AlN) or zinc oxide (ZnO).

23. The system of claim 17 wherein the heat transfer layer comprises a metal.

24. The system of claim 23 wherein the metal comprises gold (Au) or aluminum (Al).

* * * * *